United States Patent
Tanioka et al.

[11] Patent Number: 6,025,858
[45] Date of Patent: Feb. 15, 2000

[54] RECORDING HEAD AND IMAGE FORMING APPARATUS USING THE SAME

[75] Inventors: Hiroshi Tanioka, Yokohama; Kaoru Shoji, Kamisato-machi; Seiji Kakimoto, Honjo; Toshihiko Ohtsubo, Machida; Mitsuru Amimoto, Yokohama; Mitsuo Shiraishi, Kawasaki; Nobuhiko Watanabe, Kamikawa-machi, all of Japan

[73] Assignees: Canon Kabushiki Kaisha; Canon Component Kabushiki Kaisha, both of Tokyo, Japan

[21] Appl. No.: 09/010,790

[22] Filed: Jan. 22, 1998

[30] Foreign Application Priority Data

Jan. 30, 1997 [JP] Japan ..................... 9-016474

[51] Int. Cl.[7] .................................................. H01L 21/60
[52] U.S. Cl. .............................. 347/129; 29/825; 347/238
[58] Field of Search ..................................... 347/129, 130, 347/141, 238; 29/592.1, 825, 837; 313/500

[56] References Cited

U.S. PATENT DOCUMENTS

| | | | |
|---|---|---|---|
| 4,016,449 | 4/1977 | Gale et al. ............................... | 313/500 |
| 4,843,280 | 6/1989 | Lumbard et al. ........................ | 313/500 |
| 5,451,977 | 9/1995 | Kusuda et al. ............................ | 345/44 |

FOREIGN PATENT DOCUMENTS

| | | |
|---|---|---|
| 2529128 | 9/1976 | Germany . |
| 4308896 | 9/1994 | Germany . |
| 1-238962 | 9/1989 | Japan . |
| 2-208067 | 8/1990 | Japan . |
| 2-292064 | 12/1990 | Japan . |
| 7-228003 | 8/1995 | Japan . |

*Primary Examiner*—Joan Pendegrass
*Attorney, Agent, or Firm*—Fitzpatrick, Cella, Harper & Scinto

[57] ABSTRACT

A recording head includes a recording element having a plurality of light-emitting elements, a first substrate on which the recording element is mounted, a driving unit for driving the recording element, a second substrate on which the driving unit is mounted, and bonding wires. The recording element has bonding pads, and the second substrate has through holes. The bonding wires connect the bonding pads and the inner surfaces of the through holes.

9 Claims, 7 Drawing Sheets

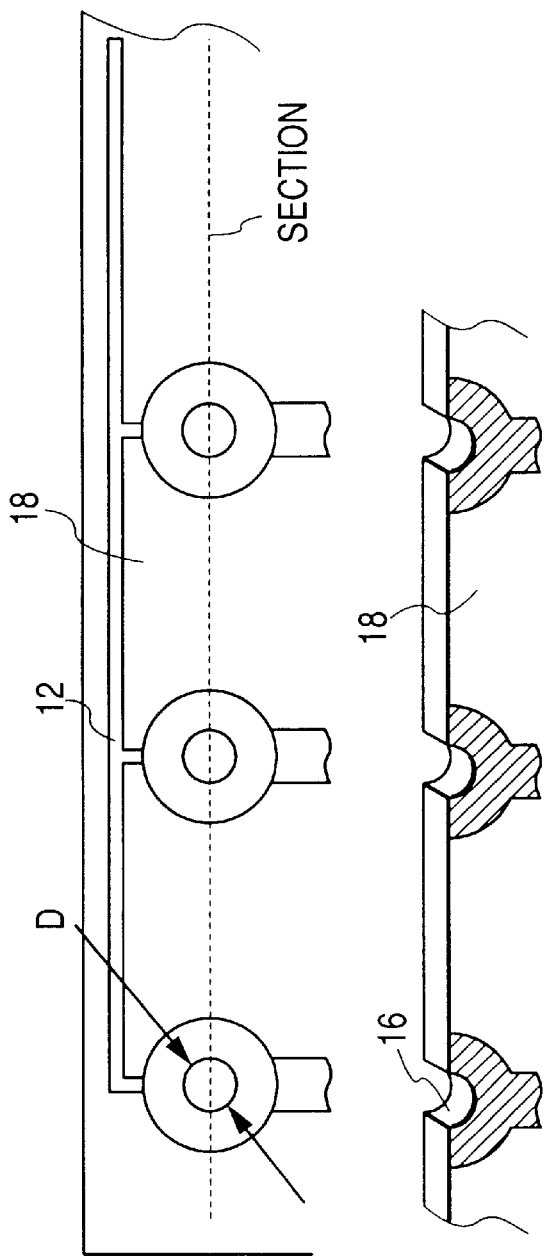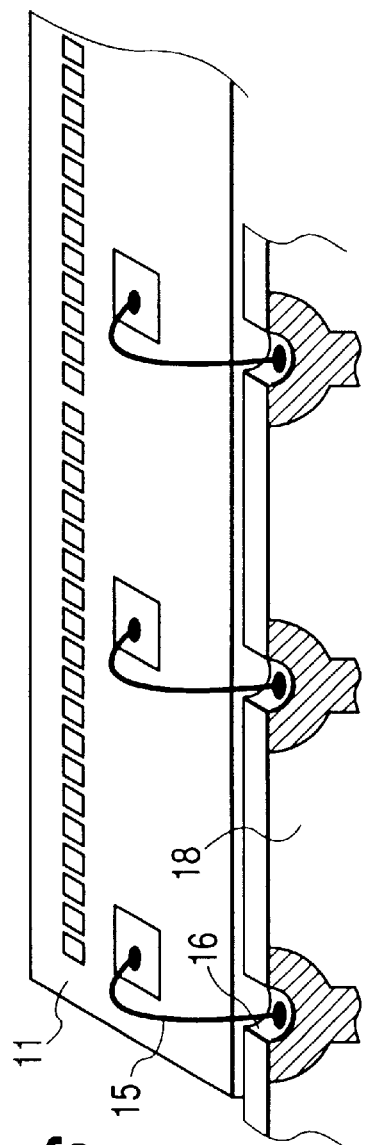

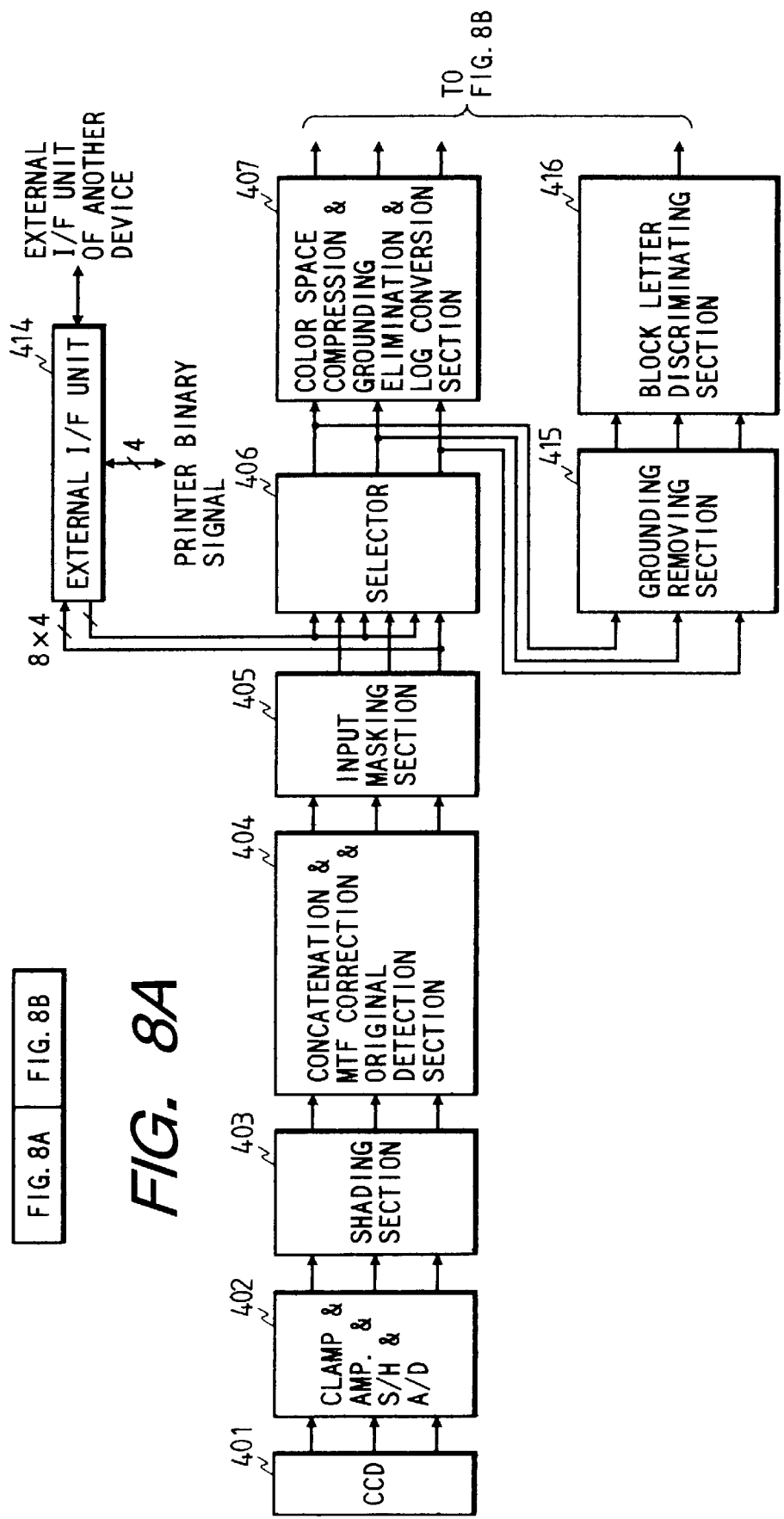

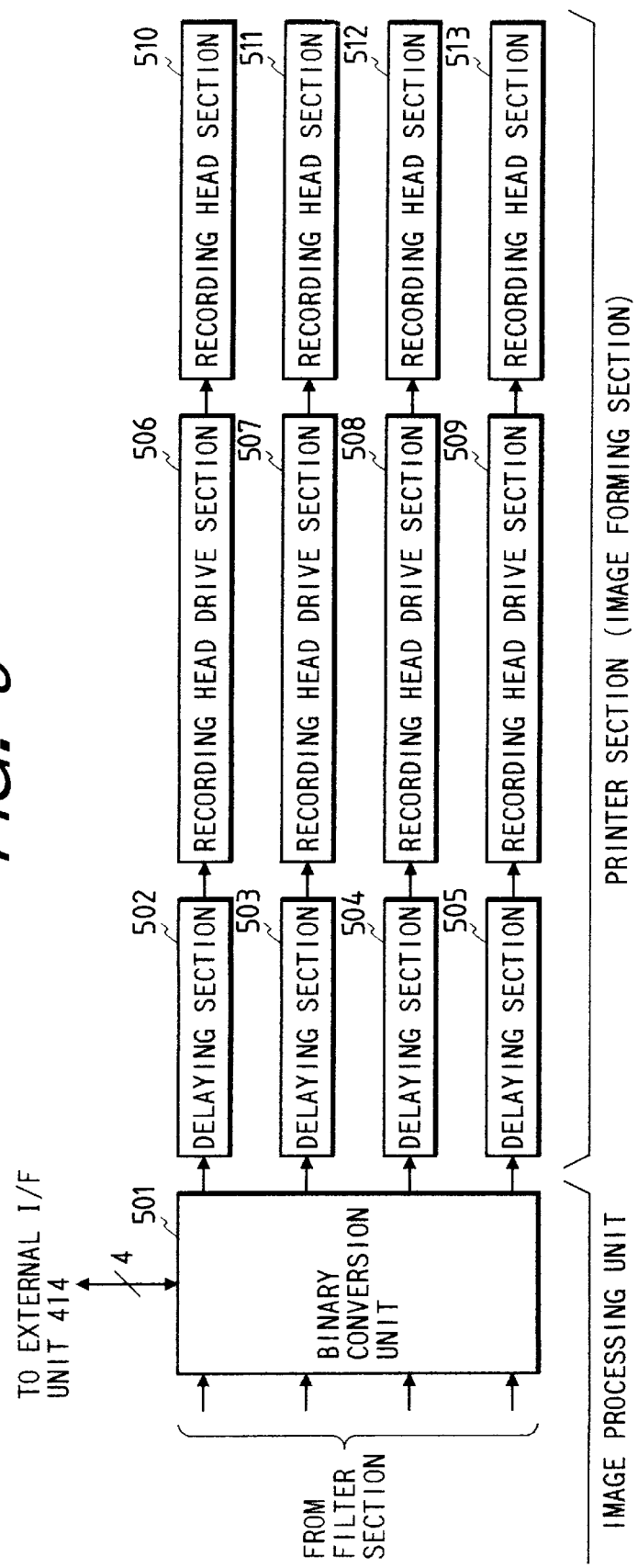

RECORDING HEAD AND IMAGE FORMING APPARATUS USING THE SAME

BACKGROUND OF THE INVENTION

1. Field of the Invention

The present invention relates to a recording head for performing image recording in an image forming apparatus such as a copying machine, a facsimile apparatus, or a printer, and a method of mounting the recording head.

2. Related Background Art

Conventionally, a recording head of this sort includes an array of solid-state recording elements represented by LEDs (light-emitting devices) and driving circuits provided in a one-to-one correspondence with these recording elements. Accordingly, a driving IC formed by integrating these driving circuits is arranged parallel and adjacent to the solid-state recording element array, and the two chips are directly connected by a large number of bonding wires.

On the other hand, it is known that in the configuration of a recording head, the number of driving ICs and the number of bonding wires between the recording elements and the driving ICs can be extremely decreased when the emission efficiency of the recording elements is increased and the recording elements are time-divisionally driven. Furthermore, U.S. Pat. No. 5,451,977 has proposed the use of so-called self-scanning type recording elements, having a function of sequentially selectively scanning recording elements to be driven, in the chip of the recording element array.

Consequently, it is possible to separate a substrate on which recording elements are mounted and a substrate on which driving circuits for driving these recording elements are mounted and to miniaturize the recording head. Electrical connecting manner in this case are a method of directly connecting the recording elements and the bonding pads of the driving circuits by bonding wires and a method of connecting these parts by flexible cables.

As described above, the two methods can be used in electrically connecting the substrate on which the recording elements are mounted and the substrate on which the driving circuits for driving the recording elements are mounted. In the former method, the length of the wires is a few mm. Also, when the two substrates are connected at an angle of 90°, these two substrates are close to each other. Therefore, if the wiring density is high or the recording head is long, e.g., about 300 mm, the reliability of the electrical connection deteriorates.

On the other hand, the latter method increases the cost because the flexible cables are used. Additionally, a flexible connection region with a width of at least about 3 mm is necessary in the substrate on which the recording elements are mounted. Therefore, the recording head cannot be so miniaturized as in the former method.

SUMMARY OF THE INVENTION

The present invention has been made in consideration of the above situation and has as its object to provide a recording head which is inexpensive, has high electrical connection reliability, is smaller than conventional recording heads, and has a small width corresponding to a small-diameter photosensitive drum, and a method of mounting the recording head.

To achieve the above object, when recording elements mounted on a first substrate and driving units mounted on a second substrate to drive the recording elements are electrically connected by bonding wires in a recording head of the present invention, the two substrates are arranged close to each other so that the upper surface of the first substrate and the inner surfaces of through holes formed in the second substrate are substantially flush with each other. In this state, the bonding pads of the recording elements and the inner surfaces of the through holes are connected by the bonding wires.

Also, when recording elements mounted on a first substrate and driving units mounted on a second substrate to drive the recording elements are electrically connected by bonding wires in a method of mounting a recording head of the present invention, the two substrates are arranged close to each other so that the upper surface of the first substrate and the inner surfaces of through holes formed in the second substrate are substantially flush with each other. In this state, the bonding pads of the recording elements and the inner surfaces of the through holes are connected by the bonding wires.

Accordingly, the width of the substrate on which the recording elements are mounted can be extremely decreased, and this substrate and the substrate on which the driving circuits are mounted can be connected by using short wires. Consequently, a recording head which is inexpensive and has high electrical connection reliability can be realized.

BRIEF DESCRIPTION OF THE DRAWINGS

FIGS. 5A and 5B are plan and perspective views, respectively, for explaining the relationship between through holes and bonding wires in the embodiment of the present invention;

FIG. 6 is a perspective view showing an embodiment of bonding wires;

FIG. 9 is a block diagram showing the arrangement of an image recording section.

DETAILED DESCRIPTION OF THE PREFERRED EMBODIMENT

An embodiment of the present invention will be described in detail below with reference to the accompanying drawings. This embodiment is applied to a 600-DPI recordable electrophotographic image forming apparatus in which light-emitting thyristors 1 to 128 are linearly arranged in one chip in accordance with the number of necessary pixels and five SLEDs (Self-Scanning Light-Emitting Devices: e.g., Japanese Patent Application Laid-Open Nos. 1-238962 and 2-208067) having a self-scanning function are linearly mounted on the same chip.

Figure 2:
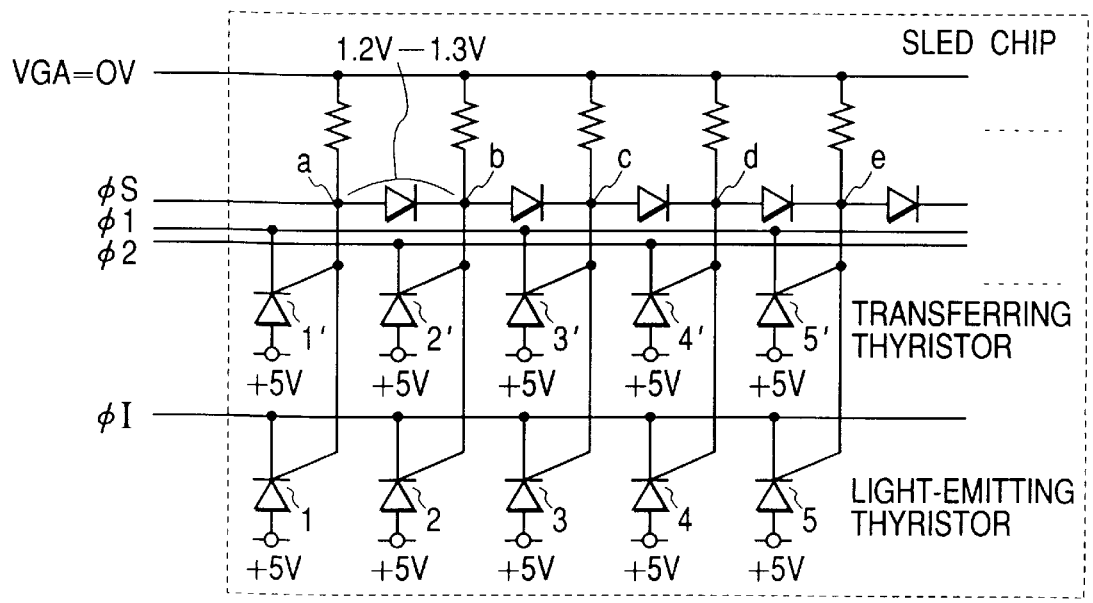
FIG. 2 is a circuit diagram of a control circuit when the recording head of the present invention is applied to an image forming apparatus.
Figure 3:
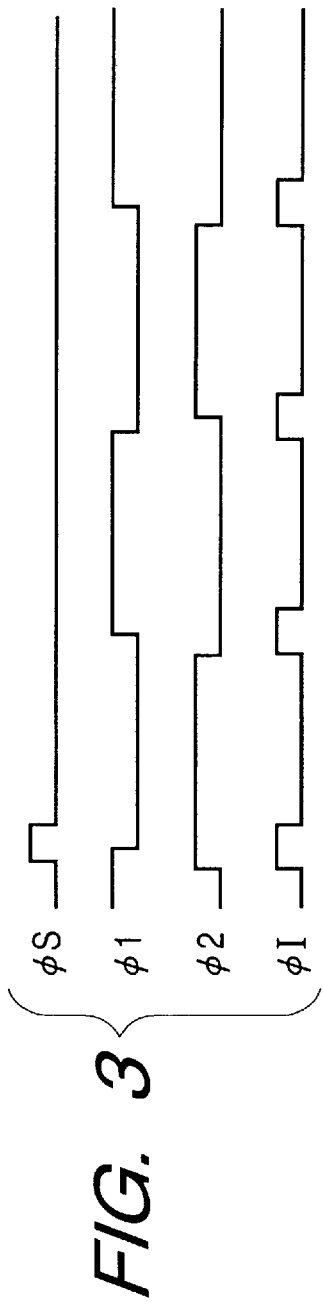
FIG. 3 is a timing chart of signals when the recording head is in operation.

The arrangement and operation of this SLED will be described below with reference to FIGS. 2 and 3. FIG. 2 shows one SLED chip (recording element) including 128 light-emitting elements. FIG. 3 shows a timing chart for driving this SLED chip.

When a scanning pulse signal φS switches from L (Low level) to H (High level), the SLED starts emitting light. When φ1 is switched from H to L while the scanning pulse signal φS is H, a leftmost transferring light-emitting thyristor 1' is turned on. When the transferring thyristor 1' is turned on, the gate voltage of this thyristor rises to the anode potential, i.e., about 5 V. Therefore, when a recording signal φI is switched from H to L at the next timing, a leftmost recording light-emitting thyristor 1 is turned on to emit light for recording. The other light-emitting thyristors cannot emit light because the gate voltage is not 5 V.

When φ1 returns from L to H, the leftmost recording light-emitting thyristor 1 is turned off. When φ2 is switched from H to L at the next timing, a transferring thyristor 2' is turned on. That is, the gate voltage (about 5 V) of the transferring thyristor 1' is connected to the gate of the thyristor 2' via a diode connected to the gate of the thyristor 1'. Therefore, when φ2 is switched to L in this state, ON conditions of the thyristor 2' are met.

When φ1 is switched from L to H, the transferring thyristor 1' is turned off, whereas the transferring thyristor 2' is kept ON. When φI is switched on, the second light-emitting thyristor is turned on. When this operation is repeated 64 times, the 128 recording light-emitting thyristors are sequentially scanned to enable selective light emission corresponding to an image signal.

Figure 4:
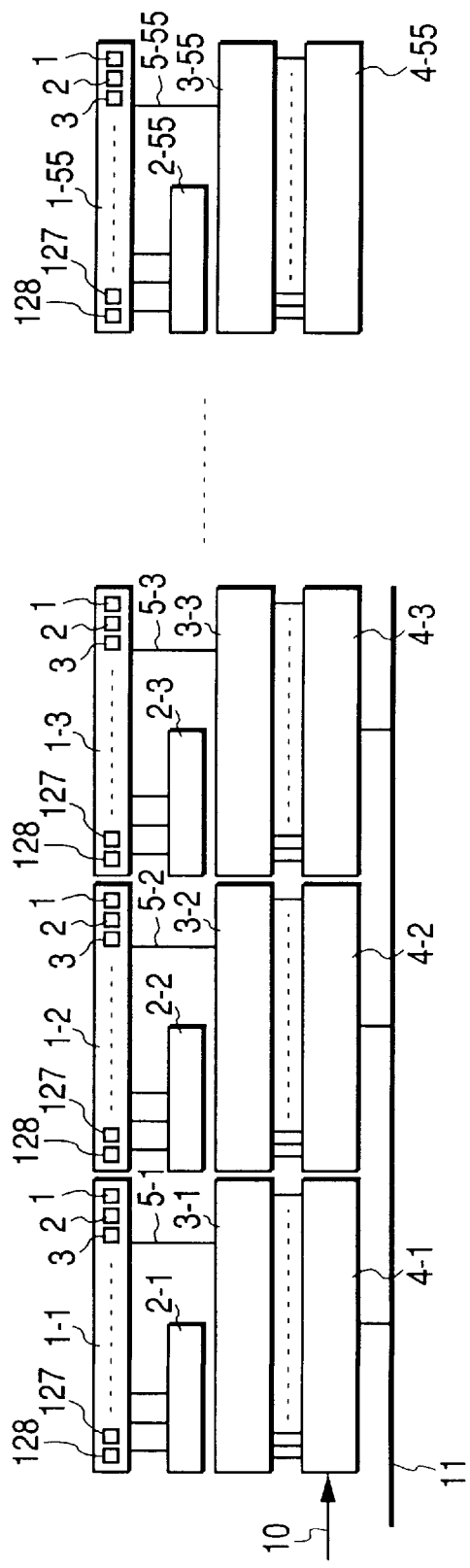
FIG. 4 is a schematic view of an entire arrangement of a driving circuit.

A driving circuit (drive controller) for driving a recording element array in which 55 SLED chips are linearly arranged will be described below with reference to FIG. 4. Referring to FIG. 4, SLED chips 1 to 55 obtain timing signals φs, φ1, and φ2 for self-scanning from circuits 2-1 to 2-55.

On the other hand, image signals are first serially applied from a signal line 10 to a shift register 4-1 and then sequentially transferred to shift registers 4-2 to 4-55. After image signals of one line, i.e., 7040 image signals are transferred, 128 image signals for driving the light-emitting elements 1 to 128 in each SLED chip are held in parallel with each other in latches 3-1 to 3-55 and converted into a serial signal φI via signal lines 5-1 to 5-55 to drive the SLED chips 1-1 to 1-55 in parallel. At this time, the internal self-scanning timing of the SLED 1-1 and the recording signal φI are synchronized as already described with reference to FIG. 3.

In FIG. 4, the 128 light-emitting elements constitute one recording element array chip. In driving this single chip, the timing signals φs, φ1, and φ2 are common to all of the 55 chips. Therefore, these signals can be commonly supplied through a wiring pattern on the substrate, so the number of connecting lines is minimized to 60.

Figure 1:
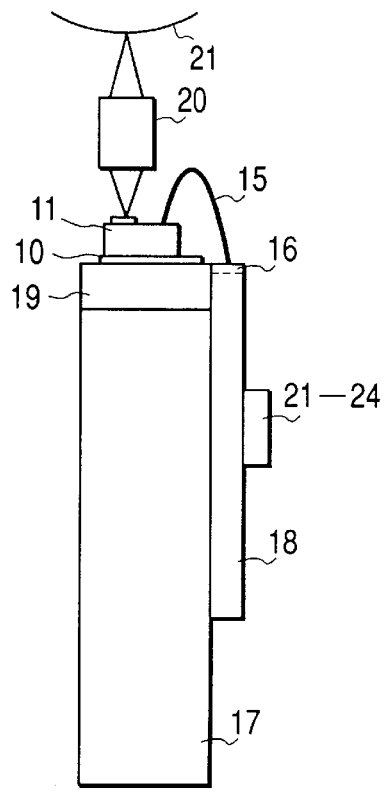
FIG. 1 is a side view showing connected substrates in a recording head according to an embodiment of the present invention.

FIG. 1 shows a recording head of the present invention. In FIG. 1, the recording element described above is denoted by reference numeral 11. A rear-surface electrode and a wiring pattern on a substrate 19 are electrically connected by silver paste 10, and 55 bonding dies are formed in the ceramic substrate 19. This substrate 19 and a driving substrate 18 on which driving controllers 22 to 24 and the like are mounted are fixed to an aluminum substrate 17.

To supply the driving signals described above, wire bonding pads formed on the surface of the recording element 11 and driving signal lines on the driving substrate 18 are connected by wire bonding using bonding wires 15 which connect the bonding pads and the inner surfaces of through holes 16 connected to the driving signal lines at the end of the driving substrate 18.

As shown in FIG. 5A, each through hole 16 of the driving substrate 18 has diameter D=0.5 to 1.0 mm, and the inner surface of the through hole 16 is electrically connected to the driving signal line. After these through holes 16 are formed by a normal substrate formation process, the inner surfaces of the through holes 16 are plated with gold about 0.5 μm thick by using a pattern 12. The through holes 16 are then cut in substantially the center to have a semicircular shape. FIG. 5B shows the state of the cut section.

The inner surface of the through hole 16 connected by wire bonding shown in FIG. 1 is a semicircular surface shown in FIG. 5B. FIG. 6 shows the state in which the bonding pads on the recording element 11 are connected to the inner surfaces of the through holes 16 by the bonding wires 15. Note that a power supply for supplying power from the rear surface of the recording element 11 and the like component are not shown. Analogously, the through holes 16 of the driving substrate 18 are directly connected to the pattern on the ceramic substrate 19 by wire bonding.

Conditions by which the present invention is actually realized in an image forming apparatus are chip width of the recording element 11=about 350 μm, width of the ceramic substrate 19=about 2 mm, thickness of the driving substrate 18=1.6 mm, and length of the bonding wire for connection= about 1.5 mm. As a consequence, the width of the end portion of the recording element 11 becomes about 4 mm. Accordingly, it is possible to extremely decrease the size of a portion in contact with a photosensitive drum 21 including the width of a converging optical fiber array 20 as an image forming lens.

Note that in FIG. 1, the driving controllers 22 to 24 described earlier are mounted on the substrate 18 as several driving ICs. Note also that to stably perform wire bonding in the through hole 16, it is also possible to form an elliptic shape oblong along the horizontal direction of the paper in addition to increasing the hole diameter to about 1 mm. In this embodiment, high-density connection was possible up to a density of about one hole/mm under conditions of hole diameter=0.5 mm and land pattern=0.8 mm.

In the above embodiment of the present invention, the driving substrate 18 is placed on one side of the substrate 19 on which the recording element 11 is mounted. However, two driving substrates 18 can also be similarly arranged and connected on the two sides. Also, although a light-emitting element having a self-scanning function is used as the recording element, the present invention is naturally applicable to an LED, an LCD, or an EL using normal matrix driving. Furthermore, it is of course possible to apply the present invention to connection between a plurality of substrates as well as to the recording element.

In the present invention as has been described in detail above, when the recording element mounted on the first substrate and the driving unit mounted on the second substrate to drive the recording element are electrically connected by bonding wires, the two substrates are arranged close to each other so that the upper surface of the first substrate and the inner surfaces of the through holes formed in the second substrate are substantially flush with each other. In this state, the bonding pads of the recording element and the inner surfaces of the through holes are connected by the bonding wires.

Accordingly, it is possible to provide an inexpensive, small-sized recording head which can be mounted with high reliability. Additionally, since the first and second connecting points of wire bonding can be arranged on substantially the same level, one-bonding processing is easy to perform.

A practical embodiment of an image forming apparatus using the recording head according to the above-mentioned embodiment of the present invention will be described below.

Figure 7:
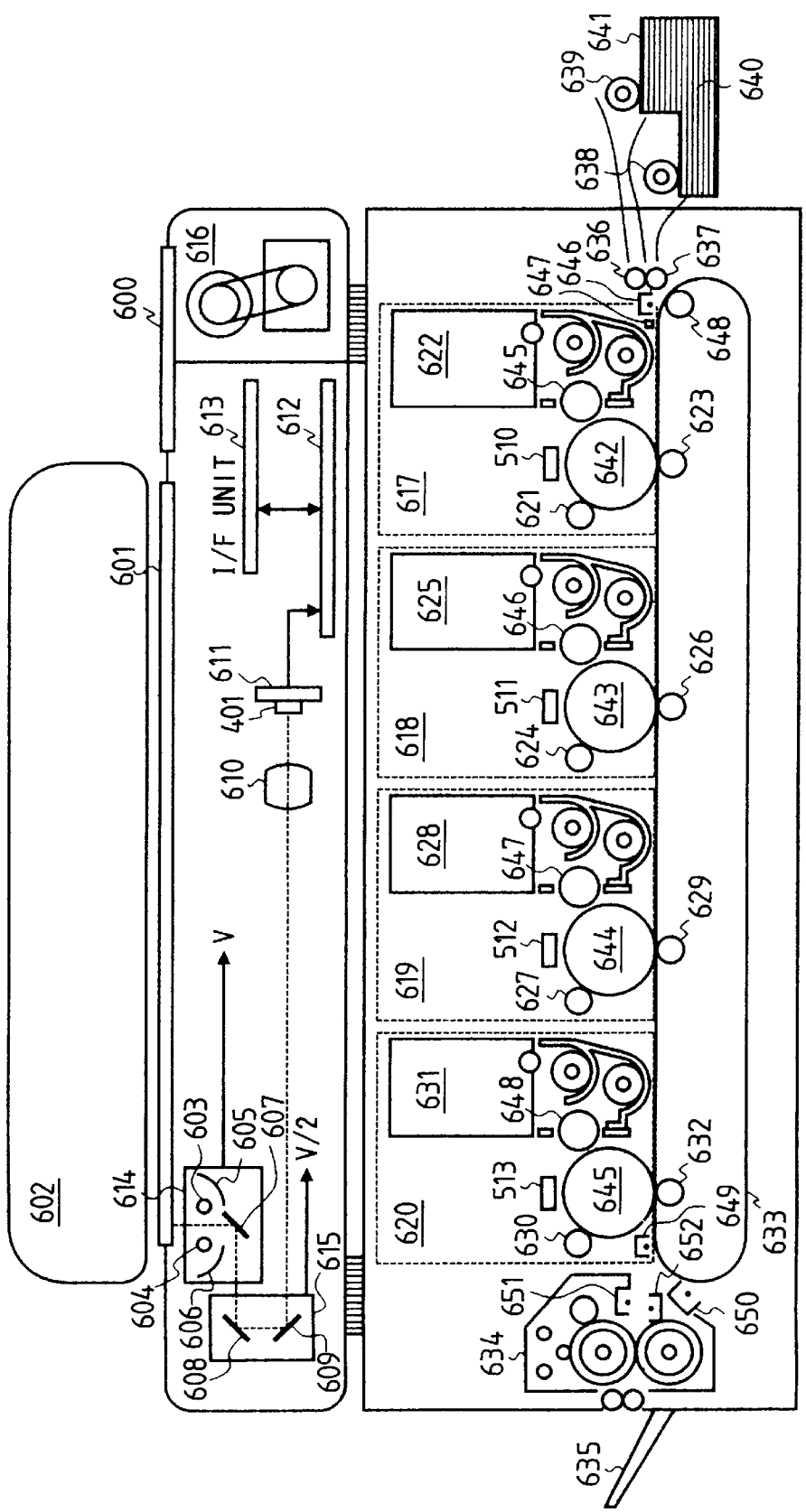
FIG. 7 is a schematic view showing the construction of a color copying machine using the recording head of the present invention.
Figure 8B:
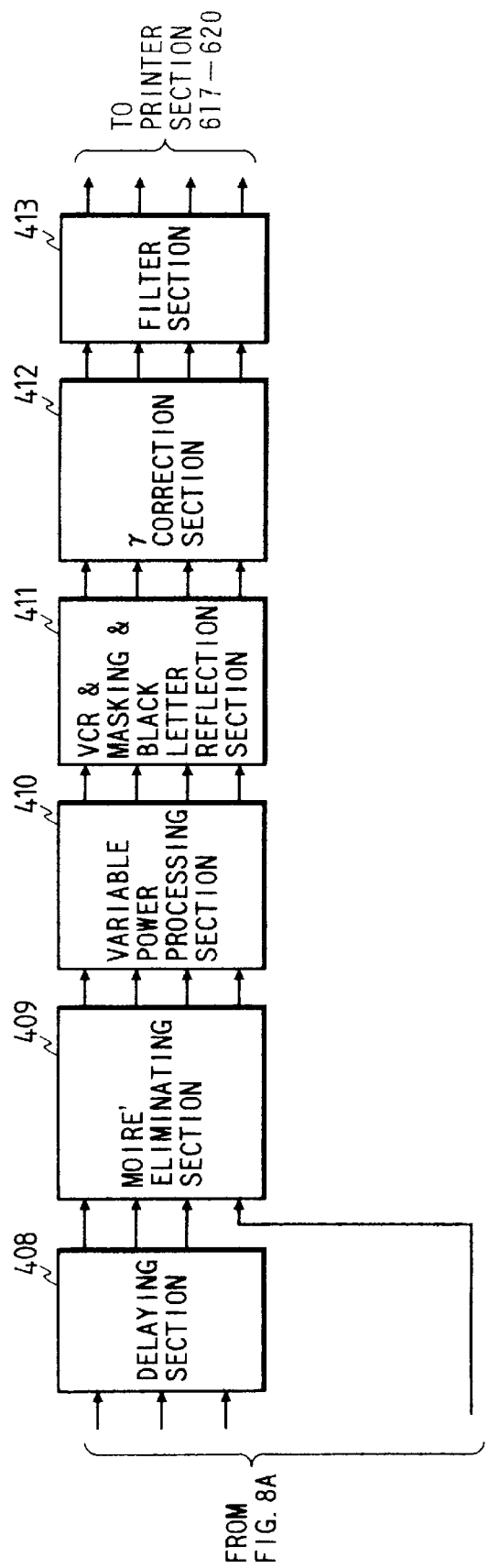
FIG. 8 comprised of FIGS. 8A and 8B is block diagram showing a detailed configuration of a digital image processing unit 612.

FIG. 7 is a schematic view showing the construction of a color copying machine using the recording head of the present invention. FIGS. 8A and 8B are block diagrams showing the configuration of a digital image processing unit 612. FIG. 9 is a block diagram showing the arrangement of an LED image recording section.

A color reader section and a printer section of the color copying machine shown in FIG. 7 will be separately described below. The recording head of the present invention constitutes a recording head drive section and a recording head section in the printer section to be described later.

(Color reader section)

The color reader section is shown in the upper portion of FIG. 7. Referring to FIG. 7, a CCD 401 is mounted on a substrate 611. An image processor 612 includes a unit 501 and sections 502 to 505 in FIG. 9 except for the CCD 401 in FIG. 7. An original glass plate (platen) 601 is arranged below a document feeder (DF) 602 (a mirror-surface press plate (not shown) can also be used instead of this document feeder 602). Light sources (halogen lamps or fluorescent lamps) 603 and 604 illuminate an original. Reflectors 605 and 606 direct the light from the light sources 603 and 604 onto an original. Mirrors 607 to 609 reflect the light, and a lens 610 focuses the reflected light from an original or the projected light onto the CCD 401. A carriage 614 carries the halogen lamps 603 and 604, the reflectors 605 and 606, and the mirror 607. A carriage 615 carries the mirrors 608 and 609. An interface (I/F) unit 613 interfaces with another IPU or the like. The carriages 614 and 615 mechanically move at velocities V and V/2, respectively, in a direction perpendicular to the electrical scan (main scan) direction of the CCD 401, thereby scanning (sub-scanning) the entire surface of an original. The color reader section also includes an operation unit 600 of the copying machine and a driving means 616 for the carriages 614 and 615.

FIGS. 8A and 8B are block diagrams showing a detailed configuration of the digital image processing unit 612. An original on the original glass plate reflects the light from the light sources 603 and 604. The reflected light is guided to the CCD 401 and converted into electrical signals (if the CCD 401 is a color sensor, RGB color filters can be arranged in-line in the order of R, G, and B on a one-line CCD or an R filter, a G filter, and a B filter can be arranged on three-line CCDs, and these filters can be formed on a chip or separated from a CCD). The electrical signals (analog image signals) are applied to the image processing unit 612 and sampled-and-held (S/H) by a clamp & amp. & S/H & A/D unit 402. Consequently, the dark levels of the analog image signals are clamped to a reference potential, and the signals are amplified to a predetermined level (the processing order is not restricted to the one described above) and A/D-converted into, e.g., R, G, and B digital signals each having 8 bits. The R, G, and B signals are subjected to shading correction and black correction in a shading section 403 and transferred to a concatenation & MTF correction & original detection section 404. If the CCD 401 is a three-line CCD, the reading position differs from one line to another. Therefore, concatenation is so performed as to adjust the delay amount of each line in accordance with the reading speed, thereby correcting the signal timings such that the three lines are read in the same position. Since the reading MTF changes in accordance with the reading speed or the magnification, MTF correction is so performed as to correct this change. Also, the original size is detected by original detection by scanning the original on the original glass plate. The digital signals whose reading position timings are thus corrected are applied to an input masking section 405 where the spectral characteristics of the CCD 401 and the spectral characteristics of the light sources 603 and 604 and the reflectors 605 and 606 are corrected. The output from the input masking section 405 is applied to a selector 406 capable of selecting an external I/F signal from an external I/F unit 414 in the I/F unit 613. The output signal from the selector 406 is applied to a color space compression & grounding elimination & log conversion section 407 and a grounding removing section 415. After the grounding of the input signal to the grounding removing section 415 is removed, the signal is applied to a black letter discriminating section 416 for discriminating black letters from the original. The black letter discriminating section 416 generates a black letter signal from the original. Meanwhile, in the color space compression & grounding elimination & log conversion circuit 407 which has also received the output signal from the selector 406, color space compression is so performed as to check whether the read image signal falls in a range within which the signal can be reproduced by a printer. If the image signal falls in this range, no correction is performed. If the image signal falls outside the range, the image signal is so corrected as to fall within the range in which the signal can be reproduced by the printer. Grounding elimination processing is then performed, and the resulting R, G, and B signals are LOG-converted into C, M, and Y signals. The timing of the output signal from the color space compression & grounding elimination & log conversion section 407 is adjusted by a delaying section 408 so as to match the timing of the signal generated by the black letter discriminating section 416. Moiré is removed from these two types of signals by a moiré eliminating section 409, and the signals are subjected to variable power processing in the main scan direction by a variable power processing section 410. In a UCR & masking & black letter reflection section 411, UCR processing is performed for the C, M, and Y signals processed by the variable power processing section 410 to generate C, M, Y, and K signals, which are corrected into signals matching the printer output by masking processing. Additionally, the discrimination signal generated by the black letter discriminating section 416 is fed back to the C, M, Y, and K signals. The density of the signal processed by the UCR & masking & black letter reflection section 411 is adjusted by a γ correction section 412. The signal is then subjected to smoothing or edge processing by a filter section 413. The processed signal is converted from an 8-bit multivalue signal into a binary signal by a binary conversion unit 501 shown in FIG. 9. (The conversion method can be any of the dither method, error diffusion method, and improved error diffusion method.)

(Printer section)

The printer section is shown in the lower portion of FIG. 7. This printer section includes an M image forming unit 617, a C image forming unit 618, a Y image forming unit 619, and a K image forming unit 620. Since these image forming units have the same construction, the M image forming unit 617 will be described in detail below, and a description of the other image forming units will be omitted. The recording heads of the present invention form recording head drive sections 506 to 509 and recording head sections 510 to 513 shown in FIG. 9.

As shown in FIG. 7, in the M image forming unit 617, a latent image is formed on the surface of a photosensitive drum 642 by light from the recording head section 510. A primary charger 621 charges the surface of the photosensitive drum 642 to a predetermined potential, thereby preparing for latent image formation. A developing device 622 develops the latent image on the photosensitive drum 642 to form a toner image. The developing device 622 includes a sleeve 645 for performing development by applying a developing bias. A transfer charger 623 performs discharge from the back surface of a transfer belt 633, thereby transferring the toner image on the photosensitive drum 642 onto a recording sheet or the like on the transfer belt 633. In this embodiment, no cleaning unit is included in the apparatus because the transfer efficiency is high (it is of course possible to use a cleaning unit with no problem).

The procedure of forming an image on a recording sheet or the like will be described below. Recording sheets or the like stored in cassettes 640 and 641 are picked up one by one by pickup rollers 639 and 638 and supplied onto the transfer belt 633 by paper feed rollers 636 and 637. A supplied recording sheet is charged by a chuck charger 646. A transfer belt roller 648 drives the transfer belt 633 and charges the recording sheet in combination with the chuck charger 646, thereby chucking the recording sheet to the transfer belt 633. A sheet leading end sensor 647 senses the leading end of the recording sheet on the transfer belt 633. A detection signal from the sheet leading end sensor is supplied from the printer section to the color reader section and used as a sub-scan sync signal when the color reader printer sends a video signal to the printer section.

Thereafter, the recording sheet is conveyed by the transfer belt 633, and toner images are formed on the recording sheet in the order of M, C, Y, and K by the image forming units 617 to 620. The recording sheet passing through the K image forming unit 620 is charge-removed by a charge remover 649 to facilitate separation from the transfer belt 633 and separated from the transfer belt 633. A separation charger 650 prevents image disturbance caused by separation discharge when the recording sheet is separated from the transfer belt 633. To increase the adhesion of toner to thereby prevent image disturbance, the separated recording sheet is charged by pre-fixing chargers 651 and 652. Finally, the toner image is thermally fixed by a fixing device 634, and the recording sheet is delivered to a sheet delivery tray 635.

Image recording performed by the recording head will be described below. As shown in FIG. 9, the binary CMYK image signal generated by the image processing unit shown in FIGS. 8A and 8B and supplied to the binary conversion unit 501 is then applied to the delaying sections 502 to 505 where the differences between the distances from the sheet leading end sensor 647 and the image forming units 617 to 620 are adjusted on the basis of the sheet leading end signal from the sheet leading end sensor 647. This allows the four colors to be printed in predetermined positions. The recording head drive sections 506 to 509 generate signals for driving the recording head sections 510 to 513. The light-emitting elements (recording head sections) arranged in line emit or do not emit light in accordance with the recording signal (image signal), thereby recording on the photosensitive drum.

As has been described above, the recording head of the present invention is small in size. Therefore, a small-diameter photosensitive drum can be used in an image forming apparatus using this recording head. This enables miniaturization of the image forming apparatus itself.

What is claimed is:

1. A recording head comprising:
    a recording element having a plurality of light-emitting elements, said recording element having a bonding pad;
    a first substrate on which said recording element is mounted;
    a driving unit for driving said recording element;
    a second substrate on which said driving unit is mounted, said second substrate having a through hole; and
    a bonding wire for connecting said bonding pad and an inner surface of said through hole.

2. A head according to claim 1, wherein said recording element has a self-scanning function.

3. A head according to claim 1, wherein said first and second substrates are arranged close to each other so that an upper surface of said first substrate and the inner surface of said through hole are substantially flush with each other.

4. An image forming apparatus comprising:
    a recording element having a plurality of light-emitting elements, said recording element having a bonding pad;
    a first substrate on which said recording element is mounted;
    a driving unit for driving said recording element;
    a second substrate on which said driving unit is mounted, said second substrate having a through hole;
    a bonding wire for connecting said bonding pad and an inner surface of said through hole; and
    a photosensitive medium on which said recording element records.

5. An apparatus according to claim 4, wherein said recording element has a self-scanning function.

6. An apparatus according to claim 4, wherein said first and second substrates are arranged close to each other so that an upper surface of said first substrate and the inner surface of said through hole are substantially flush with each other.

7. A method of mounting a recording head, comprising the steps of:
    mounting a recording element having a plurality of light-emitting elements and a bonding pad on a first substrate;
    forming a through hole in a second substrate;
    mounting a driving unit for driving said recording element on said second substrate; and
    connecting said bonding pad and an inner surface of said through hole by a bonding wire.

8. A method according to claim 7, further comprising the step of arranging said first and second substrates close to each other so that an upper surface of said first substrate and the inner surface of said through hole are substantially flush with each other.

9. A method according to claim 7, wherein said recording element has a self-scanning function.

* * * * *

UNITED STATES PATENT AND TRADEMARK OFFICE
CERTIFICATE OF CORRECTION

PATENT NO. : 6,025,858

DATED : February 15, 2000

INVENTOR(S): HIROSHI TANIOKA, ET AL.

It is certified that error appears in the above-identified patent and that said Letters Patent is hereby corrected as shown below:

COLUMN 1:
Line 34, "Electri-" should be deleted; and
Line 35, "cal" should read --The manner of electrical;
"manner" should be deleted; and Are" should read --includes--.

COLUMN 3:
Line 35, "φs" should read --φS--; and
Line 51, "φs" should read --φS--.

Signed and Sealed this

Thirteenth Day of February, 2001

*Attest:*

NICHOLAS P. GODICI

*Attesting Officer*     Acting Director of the United States Patent and Trademark Office